United States Patent
Lee et al.

(10) Patent No.: US 7,566,652 B2
(45) Date of Patent: Jul. 28, 2009

(54) ELECTRICALLY INACTIVE VIA FOR ELECTROMIGRATION RELIABILITY IMPROVEMENT

(75) Inventors: Ki-Don Lee, Plano, TX (US);
Young-Joon Park, Plano, TX (US);
Ennis Takashi Ogawa, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 170 days.

(21) Appl. No.: 11/491,846

(22) Filed: Jul. 24, 2006

(65) Prior Publication Data

US 2008/0017989 A1    Jan. 24, 2008

(51) Int. Cl.
*H01L 21/20* (2006.01)

(52) U.S. Cl. .................. 438/626; 438/633; 438/636; 438/675; 438/732; 438/748; 257/E21.525; 257/E21.576; 257/E21.577; 257/E21.582; 257/E23.105; 257/E23.145; 257/E23.151; 257/E23.167; 257/E23.194

(58) Field of Classification Search .................. 438/622, 438/637–638; 257/774, 758, E21.525, 576, 257/577, 582, E23.105, 142, 145, 151, 152, 257/167, 194

See application file for complete search history.

(56) References Cited

U.S. PATENT DOCUMENTS

| | | | |
|---|---|---|---|
| 5,693,568 A | 12/1997 | Liu et al. | |
| 6,004,876 A | 12/1999 | Kwon et al. | |
| 6,080,660 A | 6/2000 | Wang et al. | |
| 6,306,732 B1 | 10/2001 | Brown | |
| 6,383,920 B1 * | 5/2002 | Wang et al. | 438/639 |
| 6,459,156 B1 * | 10/2002 | Travis et al. | 257/774 |
| 6,522,013 B1 | 2/2003 | Chen et al. | |
| 6,958,542 B2 * | 10/2005 | Hasunuma et al. | 257/758 |
| 7,251,799 B2 * | 7/2007 | Nogami et al. | 716/10 |
| 2004/0067638 A1 | 4/2004 | Hau-Riege | |
| 2005/0090097 A1 | 4/2005 | Zhang et al. | |
| 2005/0118800 A1 * | 6/2005 | Brakensiek et al. | 438/633 |
| 2005/0179134 A1 * | 8/2005 | Matsubara | 257/758 |
| 2007/0045850 A1 * | 3/2007 | Nogami et al. | 257/758 |

* cited by examiner

*Primary Examiner*—Michael S Lebentritt
(74) *Attorney, Agent, or Firm*—Wade J. Brady, III; Frederick J. Telecky, Jr.

(57) ABSTRACT

A semiconductor device 300 includes a metal line 304 formed in a first dielectric layer 302. A capping layer 306 is formed the metal line 304. A second dielectric layer 308 is formed over the first dielectric layer 302 and the metal line 304. A first via 310 is formed in the second dielectric layer 308 and in contact with the metal line 304. A second via 312 is formed in the second dielectric layer 308 and in contact with the metal line 304, and is positioned a distance away from the first via 310. An electrically isolated via 326 is formed in the second dielectric layer 308 and in contact with the metal line 304 and in between the first via 310 and the second via 312. A third dielectric layer 314 is formed over the second dielectric layer 308. First and second trenches 316, 318 are formed in the third dielectric layer 314 and in contact with the first via 310 and the second via 312, respectively. An isolated trench 328 is formed in the third dielectric layer and in contact with the isolated via 326. The isolated via 326 mitigates void formation and/or void migration during operation/conduction with electrons traveling from the first trench 316 to the second trench 318 via the metal line 304.

17 Claims, 4 Drawing Sheets

ELECTRICALLY INACTIVE VIA FOR ELECTROMIGRATION RELIABILITY IMPROVEMENT

FIELD OF THE INVENTION

The present invention relates generally to semiconductor fabrication and, more particularly, to devices and methods that mitigate electromigration induced failure by employing an inactive punch-via.

BACKGROUND OF THE INVENTION

Integrated circuits and semiconductor devices are fabricated by performing a number of fabrication processes that form various components and regions, such as source/drain regions, gate structures, isolation regions, and the like. One set of structures formed and/or present in semiconductor devices are metallization layers, which provide electrical connections between various components within the devices and external connections.

The metallization layers typically comprise trenches and vias formed in single or dual damascene fabrication processes. The trenches and vias are comprised of conductive materials and are separated by insulating layers comprised of dielectric material to, for example, mitigate crosstalk between various layers. The trenches and vias form interconnects or pathways through the dielectric material.

As device sizes continue to shrink to enable fast operational speeds and higher densities, problems can be encountered for metallization layers. Higher current tends to pass through smaller trenches and vias. As a result, problems such as electromigration can occur. Electromigration is the movement of conductive or metal ions as a result of current passing there through. In, for example, copper vias, electromigration can cause copper ions to migrate and result in formation of void regions within the copper vias. Generally, for electromigration, a compressive stress increases in an anode region of a via while a tensile stress increases in a cathode region. There tends to be a movement of metal or conductive material that leads to void formation in locations of tensile stress.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Aspects of the present invention facilitate semiconductor device fabrication and operation by employing isolated conductive regions to mitigate void creation and/or void migration due to electromigration. The aspects can be employed with single-damascene and/or dual-damascene processes. One or more electrically isolated conductive regions, such as isolated vias, are positioned and in contact with a conductive layer such as a metal line between cathode and anode portions. The isolated conductive regions create flux divergence positions that mitigate tensile stress created at the cathode portion and elsewhere. As a result, the tensile stress does not exceed a critical or threshold value and mitigates void formation or nucleation.

In accordance with one aspect of the invention, a semiconductor device includes a metal line formed in a dielectric layer. A capping layer is formed on the metal line. A second dielectric layer is formed over the dielectric layer and the metal line. A first via is formed in the second dielectric layer and in contact with the metal line. A second via is also formed in the second dielectric layer and in contact with the metal line, and is positioned a distance away from the first via. An electrically isolated via is formed in the second dielectric layer and in contact with the metal line and in between the first via and the second via. A third dielectric layer is formed over the second dielectric layer. First and second trenches are formed in the third dielectric layer and in contact with the first via and the second via, respectively. An isolated trench is formed in the third dielectric layer and in contact with the isolated via for dual damascene process. The isolated via mitigates void formation and/or void migration during operation/conduction with electrons traveling from the first trench to the second trench via the metal line. Other devices and methods of fabrication are disclosed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

Aspects of the present invention facilitate semiconductor device fabrication and operation by employing isolated conductive regions to mitigate void creation and/or void migration due to electromigration. The aspects can be employed with single-damascene and/or dual-damascene processes. One or more electrically isolated conductive regions, such as isolated vias, are positioned and in contact with a conductive layer such as a metal line between cathode and anode portions. The isolated conductive regions create flux divergence positions that mitigate tensile stress created at the cathode portion and elsewhere. As a result, the tensile stress can be prevented from exceeding a critical or threshold value and mitigates void formation or nucleation.

Figure 1:
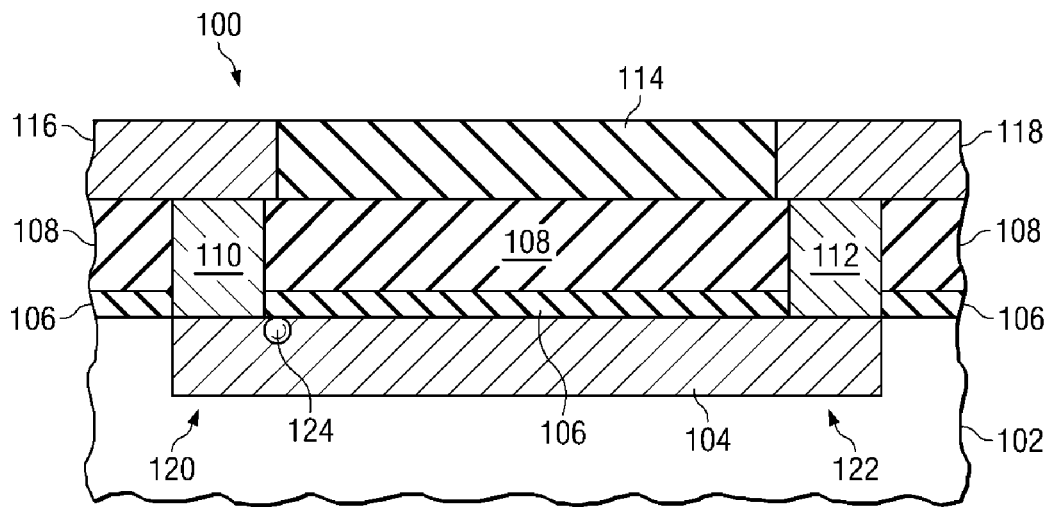
FIG. 1 is a cross sectional view of a semiconductor device having a metal line.

FIG. 1 is a cross sectional view of a semiconductor device 100 having a metal line. The view is provided as an example to show formation and configuration of metal lines, vias, and trenches in a semiconductor device and associated electromigration issues.

The semiconductor device 100 includes a first dielectric layer 102. For illustrative purposes, underlying layers such as, for example, a semiconductor substrate, contacts, active regions, source drain regions, gate structures, and the like are not shown, but may be present. A metal line 104 is formed in the first dielectric layer 102. The metal line 104 is comprised of a conductive material, such as copper, aluminum-copper, and the like. In one example, the metal line 104 has a thickness of about 1000 to about 10000 Angstroms. Although not shown, a metal barrier layer can be located on bottom and side surfaces of the metal line 104. A capping layer 106 is formed over the metal line 104. The capping layer 106 is comprised of a suitable material, such as, for example, SiCN, SiN, and the like. The capping layer 106 can serve a number of functions including, but not limited to, protecting the metal line 104, mitigate diffusion, and the like.

A second dielectric layer 108 is located over the metal line 104. The second dielectric layer 108 can be formed by a suitable process, such as a chemical vapor deposition process (CVD), plasma enhanced CVD, a spin on process, and the like. In one example, the second dielectric layer 108 is comprised of silicon dioxide, however other dielectric materials, including low-k dielectric materials, borophosphosilicate (BPSPG) glass, and the like. A suitable thickness for the dielectric layer 108, in one example is about 1000 to about 10000 Angstroms.

A first via 110 and a second via 112 are formed in the second dielectric layer 108 and through the capping layer 106 and are in electrical contact with the metal line 104. The first via 110 and the second via 112 are comprised of a conductive material and can also include a metal or conductive barrier layer. The second via 112 is positioned a distance along the metal line 104 from the first via 110. In one example, a plasma etch process is employed to form via openings, which are then filled with a conductive material, such as copper, a copper alloy, tungsten (W), aluminum, and the like followed by a chemical mechanical planarization process. Prior to filling via openings, a barrier layer comprised of, for example, Ta, TaN, TaSiN, Ti, TiN, TiW, W and WN can be formed within the via openings. The barrier layer, if present, can be formed with a process including CVD, plasma enhanced CVD, PVD, atomic layer deposition, and the like.

A third dielectric layer 114 is located or formed over/on the second dielectric layer 108. The third dielectric layer 114 is also comprised of a dielectric material, such as silicon dioxide, BPSG, and the like. A first trench 116 is formed within the third dielectric layer 114 and in electrical contact with the first via 110. The first trench 116 is comprised of a conductive material. A second trench 118 is also formed within the third dielectric layer 114 concurrently with the first trench and is in electrical contact with the second via 112. The second trench 118 is also comprised of a conductive material. It is noted that, for a dual damascene process, the trenches 116, 118 and vias 110, 112 can be formed at the same time and the second and third dielectric layers 108, 114 can comprise a single dielectric layer.

A conductive path results from the first trench 116, through the first via 110, the metal line 104, and the second via 112 to the second trench 118. In this example, electrons travel from the first trench 116 to the second trench 118 and thus define a cathode portion 120 and an anode portion 122 of the metal line 104.

As the electrons travel from the cathode portion 120 to the anode portion 122, the electrons bump into metal ions, such as copper ions, and the physical interaction of the electrons with the metal ions can move the metal ions. This migration is referred to as electromigration. Thus, metal ions are moved away from the cathode portion 120 and toward the anode portion 122. As a result, tensile stress is generated at the cathode portion 120 from migrated metal ions and compressive stress is generated at the anode portion 122 from the migrated metal ions. If the tensile stress exceeds a threshold amount and/or enough metal ions migrate away from the cathode portion 120, one or more voids 124 can be created. A portion of the metal line 104 near an interface with the capping layer 106 and proximate to the first via is particularly susceptible to void formation or void nucleation.

As electromigration continues, the one or more voids can increase in size thereby increasing resistance. In one example, device failure is assumed at an increase in resistance of 20 percent or more. Ultimately, the void(s) can increase in size enough so as to block conduction.

Figure 2:
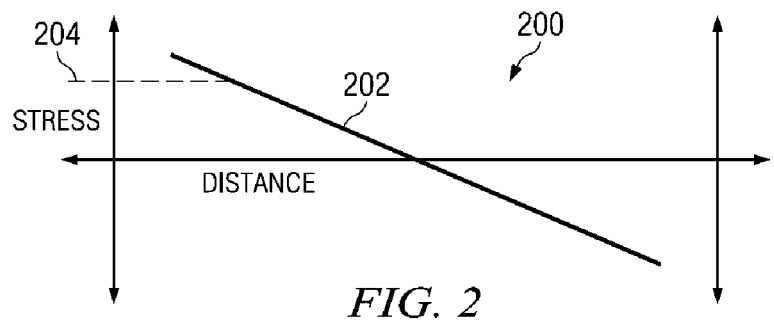
FIG. 2 is a graph illustrating electromigration induced stress within a metal line as a function of distance at steady state.

FIG. 2 is a graph 200 illustrating stress within a metal line as a function of distance. The graph 200 is provided as an example as a simulation and to facilitate a better understanding of the present invention. The graph 200 depicts tensile and/or compress stress at various locations of the metal line from a cathode portion to an anode portion. FIG. 1 depicts an example device for which the graph 200 can be representative and assumes electrons flowing from the cathode portion to the anode portion.

An x axis depicts distance horizontally along the metal line starting from a cathode portion of the metal line to an anode portion of the metal line. As an example, the distance could correspond to the horizontal distance from the cathode portion 120 to the anode portion 122 shown in FIG. 1. A y axis depicts stress wherein positive values indicate tensile stress and negative values indicate compressive stress.

A line 202 depicts a steady state stress for a semiconductor device, such as shown in FIG. 1. The line 202 has a relatively steady slope that, as appreciated by the inventors of the present invention, is a function of current density in the metal line. The line 202 generally has an average stress value at about a midpoint between the cathode and anode portions. As the position moves toward the anode portion, compressive stress increases. Similarly, as the position moves toward the cathode portion, tensile stress increases.

The inventors of the present invention appreciate that void formation can or will result if the tensile stress exceeds a critical or threshold value. An example critical value 204 is shown on FIG. 2 and tensile stress exceeding this amount can or typically will result in void formation, such as the void formation 124 shown in FIG. 1. Thus, for a given current density and critical value, a threshold distance between cathode and anode portions can be determined for which void formation or nucleation does not occur. For lines with distances below this threshold distance, void nucleation or formation does not occur. This effect is referred to as the electromigration (EM) short length effect or Blech effect. However, exceeding the threshold distance can result in void formation or nucleation.

Figure 3:
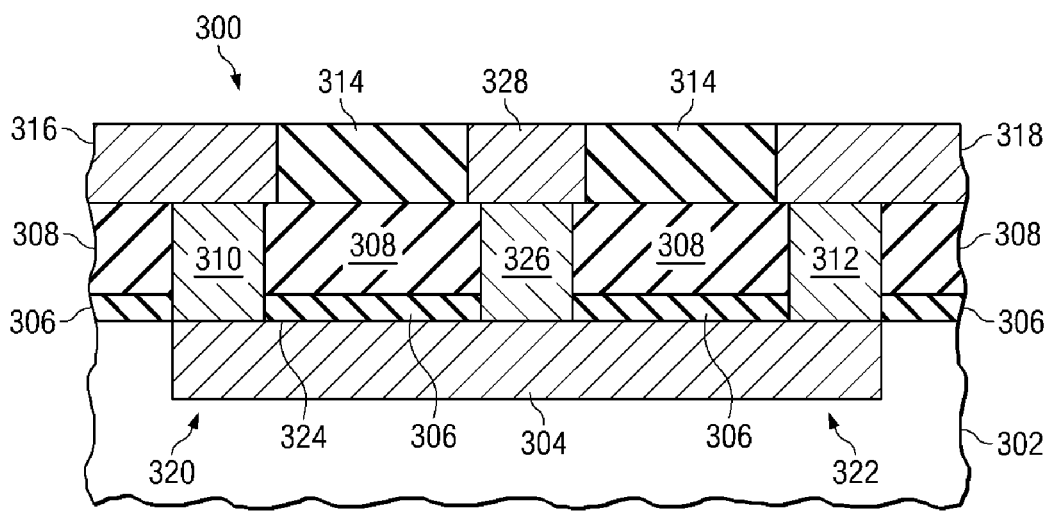
FIG. 3 is a cross sectional view of a semiconductor device having a metal line and an electrically inactive via in accordance with an aspect of the present invention.

FIG. 3 is a cross sectional view of a semiconductor device 300 having a metal line and an electrically inactive via in accordance with an aspect of the present invention. The view is provided as an example to show formation and configuration of metal lines, vias, and trenches in a semiconductor device and associated electromigration issues and a device that mitigates electromigration.

The semiconductor device 300 includes a first dielectric layer 302. In one example, the first dielectric layer 302 is an inter-metal dielectric (IMD) layer. For illustrative purposes, underlying layers such as, for example, a semiconductor substrate, contacts, active regions, source drain regions, gate structures, and the like are not shown, but may be present. A metal line or layer 304 is formed in the layer 302. The metal line 304 is comprised of a conductive material, such as copper, aluminum-copper, and the like. In one example, the metal line 304 has a thickness of about 1000 to about 10000 Angstroms. The term metal line is synonymous with trench and is employed to depict a trench or other conductive layer formed within the first dielectric layer 302 in order to facilitate understanding of the present invention. Although not shown, a metal barrier layer can be located on bottom and side surfaces of the metal line 304. A capping layer 306 is formed over the metal line 304. The capping layer 306 is comprised of a suitable material, such as, for example, SiCN, SiN, and the like. The capping layer 306 can serve a number of functions including, but not limited to, protecting the metal line 304, mitigate diffusion, and the like.

A second dielectric layer 308 is located over the metal line 304. In one example, the second dielectric layer 308 is an inter-layer dielectric (ILD) layer. The second dielectric layer 308 can be formed by a suitable process, such as a chemical vapor deposition process (CVD), plasma enhanced CVD, a spin on process, and the like. In one example, the second dielectric layer 308 is comprised of silicon dioxide, however other dielectric materials, including low-k dielectric materials, borophosphosilicate (BPSPG) glass, and the like. A suitable thickness for the second dielectric layer 308, in one example is about 1000 to about 10000 Angstroms.

A first via 310, a second via 312, and an electrically isolated via 326 are formed in the second dielectric layer 308 and through the capping layer 306 and in electrical contact with the metal line 304. The vias 310, 312, 326 are comprised of a conductive material and can also include a metal or conductive barrier layer. The second via 312 is positioned a distance along the metal line 304 from the first via 310. The electrically isolated via 326 is formed in the second dielectric layer 308 in between the first and second vias 310, 312.

In one example, a plasma etch process is employed to form via openings, which are then filled with a conductive material, such as copper, a copper alloy, tungsten (W), aluminum, and the like followed by a chemical mechanical planarization process, for single-damascene processes. Prior to filling via openings, a barrier layer comprised of, for example, Ta, TaN, TaSiN, Ti, TiN, TiW, W and WN can be formed within the via openings. The barrier layer, if present, can be formed with a process including CVD, plasma enhanced CVD, atomic layer deposition, PVD, and the like.

A third dielectric layer 314 is located or formed over the second dielectric layer 308. The third dielectric layer 314 is also comprised of a dielectric material, such as silicon dioxide, BPSG, and the like. In one example, the third dielectric layer 314 is an IMD layer and can be formed with the second dielectric layer 308 as a single layer, such as with a dual damascene approach. A first trench 316, a second trench 318, and an isolated trench 328 are formed within the third dielectric layer 314. The trenches 316, 318, 328 are comprised of a conductive material. The term "trench" is synonymous with metal line and is employed herein to illustrate a trench or line formed above the metal line 304 to facilitate an understanding of the present invention. The first trench 316 is formed in electrical contact with the first via 310 and the second trench 318 is formed in electrical contact with the second via 312. The isolated trench 328 is formed in electrical contact with the isolated via 326. The isolated trench 328 and the isolated via 326 are electrically inactive from other components, such as other metal lines, vias, pads, active devices, passive devices, and the like.

For dual-damascene processes, the third dielectric layer 314 and the second dielectric layer 308 are formed as a single layer. In one example, cavities are formed in the single dielectric layer 314, 308 and then filled to form the vias 310, 326, 312 and the trenches 316, 318, 328 simultaneously.

A conductive path results from the first trench 316, through the first via 310, the metal line 304, and the second via 312 to the second trench 318. In this aspect, electrons travel from the first trench 316 to the second trench 318 and thus define a cathode portion 320 and an anode portion 322 of the metal line 304. The isolated via 326 is positioned along that path and in between the first via 310 and the second via 312. As electrons travel from the cathode portion 320 to the anode portion 322, an additional flux divergence point is generated about the isolated via 326 because of a slow diffusion path at an interface between the isolated via 326 and the metal line 304. As a result, conduction and electromigration along the metal line 304 occurs as if there were two shorter interconnects taking the place of the cathode to anode portion of the metal line 304. Because of the shorter distances, tensile strength does not exceed critical levels and void nucleation or formation can be prevented.

It is noted that the isolated trench 328 can be omitted and yet still mitigated void migration by the isolated via 326.

Figure 4:
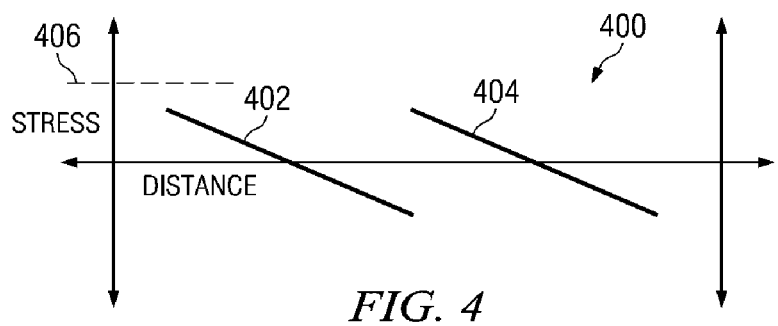
FIG. 4 is a graph illustrating stress within a metal line as a function of distance in accordance with an aspect of the present invention.

FIG. 4 is a graph 400 illustrating stress within a metal line as a function of distance in accordance with an aspect of the present invention. The graph 400 is provided as an example to facilitate a better understanding of the present invention. The graph 400 depicts tensile and/or compress stress at various locations of the metal line from a cathode portion to an anode portion wherein an isolated via is employed to mitigate void formation. FIG. 3 depicts an example device for which the graph 400 can be representative and assumes electrons flowing from the cathode portion to the anode portion.

An x axis depicts distance horizontally along the metal line starting from a cathode portion of the metal line to an anode portion of the metal line. As an example, the distance could correspond to the horizontal distance from the cathode portion 320 to the anode portion 322 shown in FIG. 3. A y axis depicts stress wherein positive values indicate tensile stress and negative values indicate compressive stress.

Lines 402 and 404 depict stress values for a semiconductor device, such as the device 300 shown in FIG. 3. The line 402 has a relatively steady slope that, as appreciated by the inventors of the present invention, is a function of current density in the metal line and corresponds to a first portion of the metal line from a cathode portion to an isolated via. Similarly, the line 404 has a relatively steady slope that, as appreciated by the inventors of the present invention, is a function of current density in the metal line and corresponds to a second portion of the metal line from the isolated via to an anode portion.

The line 402 generally has an average stress value at about a midpoint between the cathode and isolated via. As the position moves from the midpoint toward the isolated via along the metal line portion, compressive stress increases. As the position moves from the midpoint toward the cathode portion, tensile stress increases. However, the distance between the cathode portion and the isolated via is sufficiently short to avoid void nucleation.

Similarly, the line 404 generally has an average stress value at about a midpoint between the isolated via and the anode. As the position moves from the midpoint toward the anode portion, compressive stress increases. Similarly, as the position moves toward the cathode portion, tensile stress increases. However, again, the distance between the isolated via and the anode portion of the metal line is sufficient short so as to mitigate or prevent void nucleation.

Figure 5:
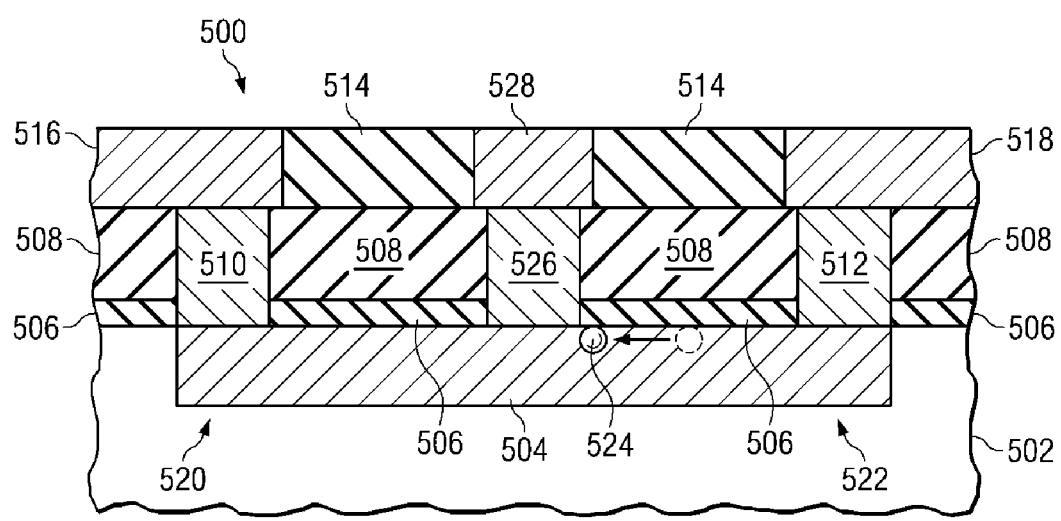
FIG. 5 is a cross sectional view of a semiconductor device having a metal line and an electrically inactive via in accordance with an aspect of the present invention.

FIG. 5 is a cross sectional view of a semiconductor device 500 having a metal line and an electrically inactive via in accordance with an aspect of the present invention. The view is provided as an example to show formation and configuration of metal lines, vias, and trenches in a semiconductor device and associated electromigration issues and a device that mitigates void formation and void migration.

The device 500 is similar to the devices previously described and omits some description for brevity. FIG. 1 and FIG. 3 can be referenced for further details.

The semiconductor device 500 includes a first dielectric layer 502. For illustrative purposes, underlying layers such as, for example, a semiconductor substrate, contacts, active regions, source drain regions, gate structures, and the like are not shown, but may be present. A metal line or layer 504 is formed in the layer 502. The metal line 504 is comprised of a conductive material, such as copper, aluminum-copper, and the like. Although not shown, a metal barrier layer can be located on bottom and side surfaces of the metal line 504. A capping layer 506 is formed over the metal line 504 and is comprised of a suitable material, such as, for example, SiCN, SiN, and the like. The capping layer 506 can serve a number of functions including, but not limited to, protecting the metal line 504, mitigate diffusion, and the like.

A second dielectric layer 508 is located over the metal line 504. The second dielectric layer 508 can be formed by a suitable process, such as a chemical vapor deposition process (CVD), plasma enhanced CVD, a spin on process, and the like.

A first via 510, a second via 512, and an electrically isolated via 526 are formed in the second dielectric layer 508 and through the capping layer 506 and in electrical contact with the metal line 504. The first via 510 is comprised of a conductive material and can also include a metal or conductive barrier layer. The second via 512 is also formed in the second dielectric layer 508 and through the capping layer 506 and in electrical contact with the metal line 504. The second via 512 is also comprised of a conductive material and can include a metal or conductive barrier layer. The second via 512 is positioned a distance along the metal line 504 from the first via 510.

The electrically isolated via 526 is formed in the second dielectric layer 508 in between the first and second vias 510, 512. The isolated via 526 is comprised of a conductive material and can include a metal or diffusion barrier layer, such as a layer comprised of tantalum.

A third dielectric layer 514 is located or formed over the second dielectric layer 508. The third dielectric layer 514 is also comprised of a dielectric material, such as silicon dioxide, BPSG, and the like. A first trench 516 is formed within the third dielectric layer 514 and in electrical contact with the first via 510. The first trench 516 is comprised of a conductive material. A second trench 518 is formed within the third dielectric layer 514 and is in electrical contact with the second via 512. The second trench 518 is also comprised of a conductive material. An isolated trench 528 is also formed in the third dielectric layer 514 and is in electrical contact with the isolated via 526. The isolated trench 528 and the isolated via 526 are electrically inactive from other components, such as other metal lines, vias, pads, active devices, passive devices, and the like. The trenches 516, 518, 528 are typically formed concurrently.

A conductive path results from the first trench 516, through the first via 510, the metal line 504, and the second via 512 to the second trench 518. In this aspect, electrons travel from the first trench 516 to the second trench 518 and thus define a cathode portion 520 and an anode portion 522 of the metal line 504. The isolated via 526 is positioned along that path and in between the first via 510 and the second via 512. As electrons travel from the cathode portion 520 to the anode portion 522, an additional flux divergence point is generated about the isolated via 526 because of a slow diffusion path at an interface between the isolated via 526 and the metal line 504.

In this aspect, a preexisting void 524 is present. The void 524 can result from, for example, electromigration, manufacturing defects, residue, faulty planarization processes, and the like. Typically, the void 524 is moved toward the cathode portion 520 as a result of electromigration. If the void moves sufficiently to the cathode portion 520, device failure and/or increased resistance can result. However, the presence of the isolated via 526 mitigates or prevents further migration of the void 524 towards the cathode portion 520. FIG. 5 shows a small movement of the void 524 for illustrative purposes and shows that the isolated via 526 prevents further movement toward the cathode portion 520, in this example.

Additionally, conduction and electromigration along the metal line 504 occurs as if there were two shorter interconnects taking the place of the cathode to anode portion of the metal line 504. Because of the shorter distances, tensile strength does not exceed critical levels and void nucleation or formation can be prevented.

It is noted that the isolated trench 528 can be omitted and yet still mitigated void migration by the isolated via 526.

Figure 6:
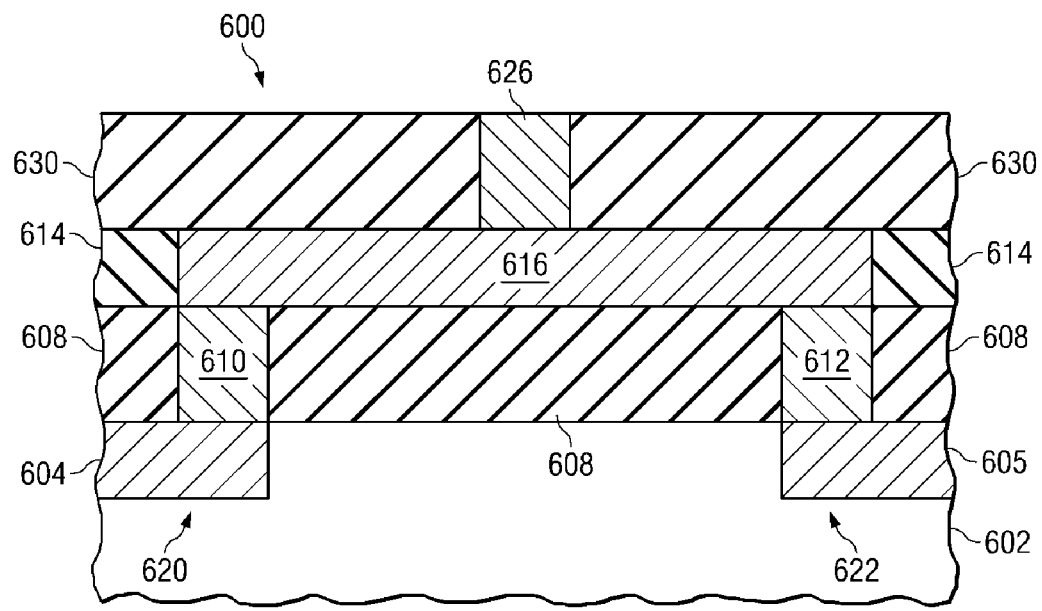
FIG. 6 is a cross sectional view of a semiconductor device having a metal line and an electrically inactive via in accordance with an aspect of the present invention.

FIG. 6 is a cross sectional view of a semiconductor device 600 having a metal line and an electrically inactive via in accordance with an aspect of the present invention. The view is provided as an example to show formation and configuration of metal lines, vias, and trenches in a semiconductor device and associated electromigration issues and a device that mitigates void formation.

The device 600 is similar to the devices previously described and omits some description for brevity. The above figures can be referenced for further details.

The semiconductor device 600 includes a first dielectric layer 602. In one example, the first dielectric layer 602 is an inter-metal dielectric (IMD) layer. For illustrative purposes, underlying layers such as, for example, a semiconductor substrate, contacts, active regions, source drain regions, gate structures, and the like are not shown, but may be present. A first metal line or layer 604 is formed in the first dielectric layer 602. The term metal line is synonymous with trench and is employed to depict a trench or other conductive layer formed within the first dielectric layer 602 in order to facilitate understanding of the present invention. The metal line 604 is comprised of a conductive material, such as copper, aluminum-copper, and the like. Although not shown, a metal barrier layer can be located on bottom and side surfaces of the metal line 604. A second metal line 605 is also formed in the first dielectric layer 602. A capping layer (not shown) can be formed over the metal lines 604, 605 and is comprised of a suitable material, such as, for example, SiCN, SiN, and the like.

A second dielectric layer 608 is located over the metal lines 604, 605. In one example, the second dielectric layer 608 is an inter-layer dielectric (ILD) layer. The second dielectric layer 608 can be formed by a suitable process, such as a chemical vapor deposition process (CVD), plasma enhanced CVD, a spin on process, and the like.

First and second vias 610, 612 are formed in the second dielectric layer 608 and through the capping layer (if present). The first via 610 and the second via 612 are comprised of a conductive material and can also include a metal or conductive barrier layer. The first via 610 is formed in contact with the first metal line 604. The second via 612 is positioned a distance from the first via 610 and is formed to be in contact with the second metal line 605, instead of the first metal line 604.

A third dielectric layer 614 is located or formed over the second dielectric layer 608. In one example, the third dielectric layer 614 is also a part of the ILD layer and can be formed with the second dielectric layer 608 as a single layer, such as with a dual damascene approach. The third dielectric layer 614 is also comprised of a dielectric material, such as silicon dioxide, BPSG, and the like. A trench 616 is formed within the third dielectric layer 614 and in electrical contact with the first via 610 and the second via 612. The trench 616 is comprised of a conductive material. The term "trench" is synonomous with metal line and is employed herein to illustrate a trench or line formed above the metal line to facilitate an understanding of the present invention.

A fourth dielectric layer 630 is formed over the third dielectric layer 614. The fourth dielectric layer is comprised of a dielectric material, such as silicon dioxide, BPSG, and the like. An isolated via 626 is formed in the fourth dielectric layer and in electrical contact with the trench 616. The isolated via 626 is electrically inactive from other components, such as other metal lines, vias, pads, active devices, passive devices, and the like.

A conductive path results from the first metal line 604, through the first via 610, the trench 616, and the second via 612 to the second metal line 605. In this aspect, electrons travel from the first metal line 604 to the second metal line 605 and thus define a cathode portion 620 and an anode portion 622 of the trench 616. The isolated via 626 is positioned along that path and in between the first via 610 and the second via 612. As electrons travel from the cathode portion 620 to the anode portion 622, an additional flux divergence point is generated about the isolated via 626 because of a slow diffusion path at an interface between the isolated via 626 and the trench 616.

Figure 7:
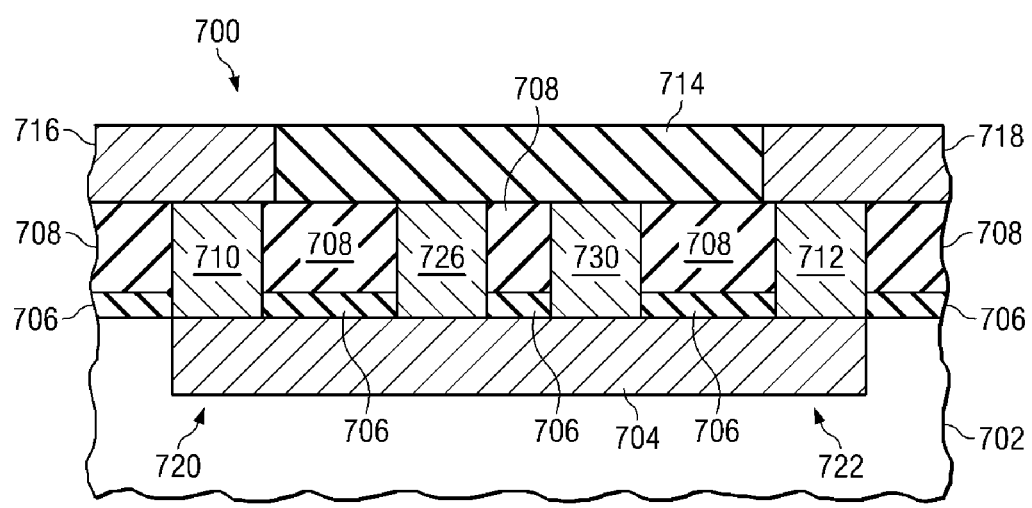
FIG. 7 is a cross sectional view of a semiconductor device having a metal line and multiple electrically isolated vias in accordance with an aspect of the present invention.

FIG. 7 is a cross sectional view of a semiconductor device 700 having a metal line and multiple electrically isolated vias in accordance with an aspect of the present invention. The view is provided as an example to show formation and configuration of metal lines, vias, and trenches in a semiconductor device and associated electromigration issues and a device that mitigates electromigration.

The semiconductor device 700 includes a first dielectric layer 702. For illustrative purposes, underlying layers such as, for example, a semiconductor substrate, contacts, active regions, source drain regions, gate structures, and the like are not shown, but may be present. A metal line or layer 704 is formed in the layer 702. The metal line 704 is comprised of a conductive material, such as copper, aluminum-copper, and the like. A capping layer 706 is formed over the metal line 704. The capping layer 706 is comprised of a suitable material, such as, for example, SiCN, SiN, and the like. The capping layer 706 can serve a number of functions including, but not limited to, protecting the metal line 704, mitigate diffusion, and the like. It is noted that the capping layer 706 can be omitted in some aspects of the invention.

A second dielectric layer 708 is located and formed over the metal line 704. The second dielectric layer 708 can be formed by a suitable process, such as a chemical vapor deposition process (CVD), plasma enhanced CVD, a spin on process, and the like. In one example, the second dielectric layer 708 is comprised of silicon dioxide, however other dielectric materials, including low-k dielectric materials, borophosphosilicate (BPSPG) glass, and the like.

A first via 710, a second via 712, a first electrically inactive via 726, and a second electrically inactive via 730 are formed in the second dielectric layer 708 and through the capping layer 706 and in electrical contact with the metal line 704. The vias 710, 712, 726, 730 are comprised of a conductive material and can also include a metal or conductive barrier layer. The second via 712 is positioned a distance along the metal line 704 from the first via 710.

The first electrically isolated via 726 is formed in the second dielectric layer 708 in between the first and second vias 710, 712 and the second electrically isolated via 730 is formed in the second dielectric layer 708 between the first isolated via 726 and the second via 712.

In one example of forming the vias 710, 712, 726, 730, a plasma etch process is employed to form via openings, which are then filled with a conductive material, such as copper, a copper alloy, tungsten (W), aluminum, and the like followed by a chemical mechanical planarization process. Prior to filling via openings, a barrier layer comprised of, for example, Ta, TaN, TaSiN, Ti, TiN, TiW, W and WN can be formed within the via openings. The barrier layer, if present, can be formed with a process including CVD, plasma enhanced CVD, atomic layer deposition, and the like.

A third dielectric layer 714 is located or formed over the second dielectric layer 708. The third dielectric layer 714 is also comprised of a dielectric material, such as silicon dioxide, BPSG, and the like. A first trench 716 is formed within the third dielectric layer 714 and in electrical contact with the first via 710. The first trench 716 is comprised of a conductive material. A second trench 718 is formed within the third dielectric layer 714 and is in electrical contact with the second via 712. The second trench 718 is also comprised of a conductive material. The isolated via 726 is electrically inactive from other components, such as other metal lines, vias, pads, active devices, passive devices, and the like.

A conductive path results from the first trench 716, through the first via 710, the metal line 704, and the second via 712 to the second trench 718. In this aspect, electrons travel from the first trench 716 to the second trench 718 and thus define a cathode portion 720 and an anode portion 722 of the metal line 704. The isolated vias 726, 730 are positioned along that path and in between the first via 710 and the second via 712. As electrons travel from the cathode portion 720 to the anode portion 722, additional flux divergence points are generated about the isolated vias 726, 730 because of a slow diffusion path at an interface between the isolated vias 726, 730 and the metal line 704. As a result, conduction and electromigration along the metal line 704 occurs as if there were two shorter interconnects taking the place of the cathode to anode portion of the metal line 704. Because of the shorter distances, tensile strength does not exceed critical levels and void nucleation or formation can be prevented.

It is noted that more than two isolated vias can be employed in order to mitigate void nucleation.

The above figures show various configurations for employing isolated conductive elements, such as the isolated vias and trenches that can be employed in semiconductor devices to mitigate void formation or nucleation and/or void migration. It is appreciated that the present invention contemplates employing the isolated conductive elements in other varied configurations and with other types of conductive layers including, but not limited to the metal lines, vias, and trenches. For example, the isolated conductive elements can be formed above or below a metal line or other conductive layer.

Figure 8:
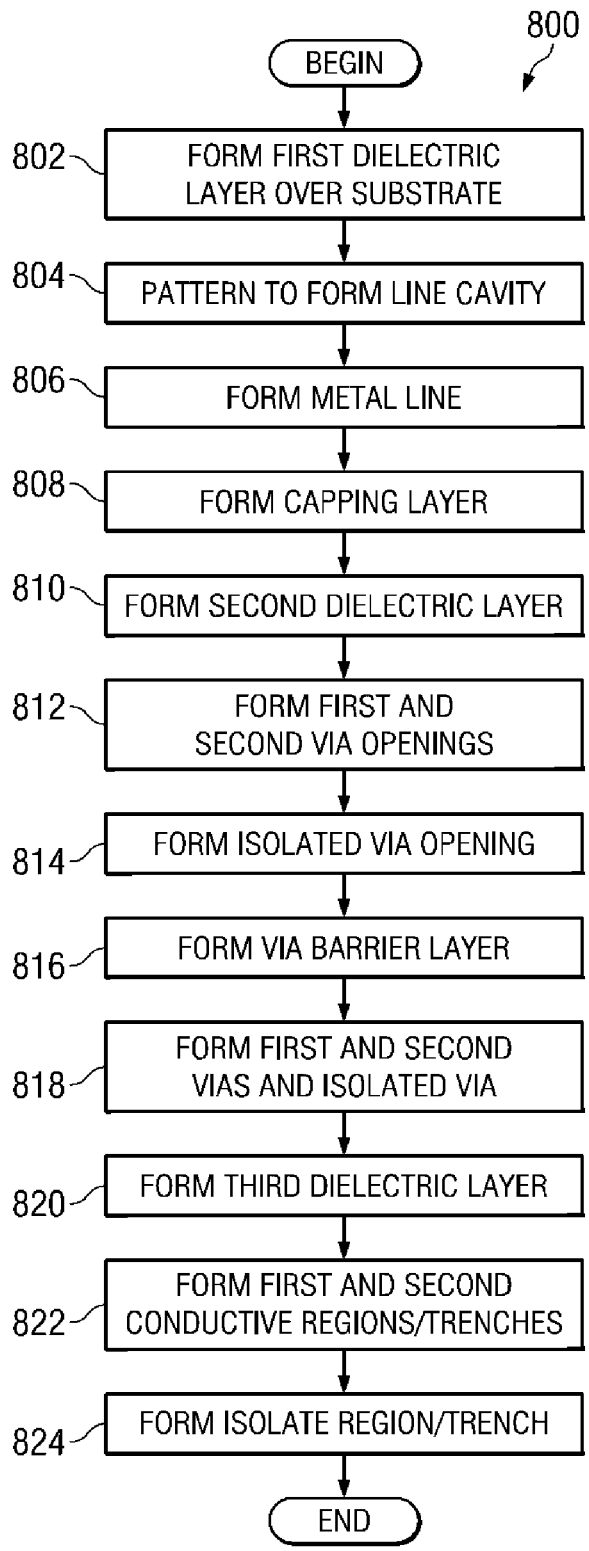
FIG. 8 is a flow diagram illustrating a method of fabricating a semiconductor device that mitigates void nucleation in accordance with an aspect of the present invention.

FIG. 8 is a flow diagram illustrating a method 800 of fabricating a semiconductor device that mitigates void nucleation in accordance with an aspect of the present invention. The method 800 fabricates an electrically isolated via so as to mitigate void nucleation/creation and/or pre-existing void migration.

The above figures can be referenced for a better appreciation of the method 800 and variations thereof.

The method begins at block 802, wherein a first dielectric layer is formed over a semiconductor substrate. The substrate can include one or more semiconductor layers, active devices, passive devices, dielectric layers, and the like. The first dielectric layer is comprised of a suitable dielectric material and is selectively patterned at block 804 to form a cavity or trench opening. In one example, photoresist is employed with an etch process to selectively form the cavity.

A metal line or layer is formed in the cavity at block 806. A suitable deposition method, such as a sputter, is employed to deposit a conductive material over the device. Subsequently, a planarization process can be performed to remove the conductive material from other portions of the device. The conductive material can include copper, aluminum, alloys thereof, and the like. Additionally, a liner or barrier layer can be formed in the cavity prior to forming the metal line to, for example, mitigate diffusion, facilitate deposition, and the like. In one example, the liner is comprised of tantalum.

The metal line includes a defined cathode portion and an anode portion wherein electrons can travel during operation of the device from the cathode portion to the anode portion.

A capping layer is formed over the metal line at block 808. The capping layer is comprised of a suitable material, such as SiN, SiCN, and the like. It is appreciated that alternate aspects of the invention omit forming the capping layer.

A second dielectric layer is formed over the first dielectric layer and the metal line at block 810. The second dielectric layer is comprised of a suitable dielectric material, such as silicon dioxide, BPSG, and the like and is formed by a suitable deposition process.

First and second via openings are formed in the second dielectric layer at block 812. A selective patterning process is employed to form the via openings down to about the metal line. An isolated via opening is also formed in the second dielectric layer at block 814. The isolated via opening can optionally be formed via the same patterning process employed to form the first and second via openings.

A conductive barrier layer is formed in the first and second via openings and the isolated via opening at block 816. The barrier layer or liner is comprised of a suitable material, such as tantalum and the like. It is appreciated that the barrier layer can be omitted in alternate aspects of the invention.

First and second vias and an isolated via are formed at block 818 by filling the via openings with a conductive material. In one example, the vias are filled with copper, tungsten, and the like.

A third dielectric layer is formed over the second dielectric layer at block 820. The third dielectric layer is comprised of a suitable dielectric material, such as silicon dioxide, BPSG, and the like and is formed by a suitable deposition process.

First and second conductive regions are formed in the third dielectric layer at block 822. The first conductive region, such as a trench, is formed so as to be in electrical contact with the first via and the second conductive region is formed so as to be in electrical contact with the second via. A suitable patterning process followed by a conductive material fill or deposition process can be employed. Some examples of suitable conductive material that can be employed for the conductive regions include, copper, aluminum, alloys thereof, and the like.

An isolated trench is formed in the third dielectric layer at block 824. The isolated trench is formed so as to be in contact with the isolated via. The isolated trench and the isolated via form a flux divergence point during operation or conducting in order to mitigate void nucleation/creation and/or void migration. It is appreciated that formation of the isolated trench can be omitted in alternate aspects of the invention.

It is noted that the above is described as a single-damascene process. However, alternate aspects of the invention include a dual-damascene process wherein the second dielectric layer and the third dielectric layer are formed as a single layer and the vias and trenches are subsequently formed therein.

It is noted that the method 800 can be performed in an order different than shown in FIG. 8. Additionally, it is appreciated that some portions of the method 800 can be omitted and/or other additionally processes performed in alternate aspects of the invention. It is further appreciated that alternate aspects of the invention can include forming additional conductive layers and the like and/or isolated vias or conductive regions in order to mitigate void nucleation and/or void migration.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Also, the term "exemplary" is intended as an example, not as a best or superior solution. Furthermore, to the extent that the term "includes" is used in either the detailed description or the claims, such term is intended to be inclusive in a manner similar to the term "comprising."

What is claimed is:

1. A method of fabricating a semiconductor device comprising:
   forming a metal line in a first dielectric layer;
   forming a second dielectric layer over the metal line;
   forming a first conductive via in the second dielectric layer and on the metal line;
   forming a second conductive via in the second dielectric layer and on the metal line at a distance from the first conductive via;

forming an electrically isolated conductive via in the second dielectric layer and on the metal line between the first and second conductive via;

forming a first conductive line over in contact with the first conductive via;

forming a second conductive line over and in contact with the second conductive via;

wherein an electric path is established by the first conductive line, the first conductive via, the metal line, the second conductive via, and the second conductive line; and wherein the electrically isolated conductive via remains electrically isolated during device operation and mitigates void formation in the metal line.

2. The method of claim 1, further comprising forming a third dielectric layer over the second dielectric layer, in which the first conductive line and the second conductive line are formed.

3. The method of claim 1, further comprising forming an electrically isolated conductive line on the electrically isolated conductive via, wherein the electrically isolated conductive line remains electrically isolated during device operation.

4. The method of claim 1, further comprising forming a capping layer on the metal line prior to forming the second dielectric layer.

5. The method of claim 4, wherein the capping layer is comprised of SiCN.

6. The method of claim 1, wherein forming the first conductive via comprises selectively etching the second dielectric layer, forming a barrier layer, and depositing a conductive material.

7. The method of claim 1, wherein the metal line comprises an existing void and movement of the void toward the first conductive via is mitigated by the electrically isolated conductive via.

8. The method of claim 1, further comprising defining a cathode portion of the metal line proximate to the first conductive via and an anode portion of the metal line proximate to the second conductive via, wherein electrons travel from the cathode portion to the anode portion.

9. The method of claim 1, wherein the metal line is comprised of copper.

10. The method of claim 1, further comprising forming one or more additional isolated conductive vias in the second dielectric layer and on the metal line in between the first and second conductive vias.

11. The method of claim 1, wherein the first conductive line and the second conductive line are formed in the second dielectric layer in a dual-damascene process concurrently with the first conductive via, the second conductive via, and the electrically isolated conductive via.

12. A method of fabricating a semiconductor device comprising:

providing a semiconductor substrate;

forming a dielectric layer over the substrate;

forming a metal line within the dielectric layer having a cathode portion and an anode portion, wherein electrons travel from the cathode portion to the anode portion during operation;

forming a first conductive region in electrical contact with the cathode portion of the metal line;

forming a second conductive region in electrical contact with the anode portion of the metal line; and forming an electrically isolated conductive region in contact with the metal line, wherein the electrically isolated conductive region remains electrically isolated during device operation and mitigates void formation about the cathode portion of the metal line and/or void migration.

13. The method of claim 12, wherein forming the metal line comprises forming a copper line.

14. The method of claim 12, further comprising forming two or more electrically isolated conductive regions in contact with the metal line which remain electrically isolated during device operation.

15. The method of claim 12, wherein the isolated conductive region is formed below the metal line.

16. The method of claim 12, wherein the isolated conductive region is formed above the metal line.

17. The method of claim 12 wherein the dielectric layer is a second dielectric layer, further comprising forming a first dielectric layer on the substrate prior to forming the second dielectric layer, wherein the first dielectric layer is at least a portion of an inter-metal dielectric layer, the second dielectric layer is an inter-layer dielectric layer, and the isolated conductive region is formed within the second dielectric layer.

* * * * *